GENERATOR OF ELECTRICAL ENERGY

Filed Dec. 3, 1964 2 Sheets-Sheet 1

United States Patent Office 3,524,772

Patented Aug. 18, 1970

3,524,772

GENERATOR OF ELECTRICAL ENERGY

David L. Purdy, Murraysville, Pa., assignor to Nuclear Materials and Equipment Corporation, Apollo, Pa., a corporation of Pennsylvania Filed Dec. 3, 1964, Ser. No. 415,637

Int. Cl. H01v 1/30

U.S. Cl. 136—205 16 Claims

ABSTRACT OF THE DISCLOSURE

A thermoelectric generator including electrically cascaded blocks or thermopiles of high-temperature-resistant (Si-Ge) and low-temperature-resistant (Pb-Te) thermoelectric elements. The connecting straps and insulating and conducting strips are brazed to the high temperature resistant elements and to each other; the straps and strips are held against the low-temperature elements by resilient pressure applied by compressed capillary screen of a heat-pipe which serves to transfer heat between the high-temperature and low-temperature elements respectively by cyclic evaporation and condensation of cesium.

This invention relates to the generation of electrical energy and has particular relationship to such generation by reliance on thermoelectric phenomena. Typically, generators in accordance with this invention are used in regions or at sites where there are no available power facilities, for example, in remote undeveloped regions of the earth or in astronautical vehicles.

Thermoelectric generator apparatus includes a thermopile or block of thermoelectric elements interposed between a heat source and a heat sink. Typically, the elements may be blocks of oppositely doped materials such as silicon germanium or lead telluride. A pair of oppositely doped blocks constitutes a thermocouple. The heat source may be a radioactive mass or a nuclear reactor; the heat sink may be water, for example; the ocean or a lake or a stream, or it may be a thermal conductor in heat-interchange relationship with the atmosphere around an astronautical vehicle. The hot junction of the thermopile is in heat-interchange relationship with the heat source and the cold junction in heat-interchange relationship with the heat sink. The thermocouples of the pile are cascaded in additive relationship so that the output potential of the pile is equal to the sum of the potentials of the individual thermoelectric elements of the pile.

It is required, that the quantity, designated herein as, $Q=V^2/K\rho$ be a maximum for a thermoelectric element or thermocouple. In this equation V is the voltage delivered by the element between its hot and cold junctions per Kelvin degree.
K is the thermal conductivity of the element.
$\rho$ is the electrical resistivity of the element.

This requirement imposes conflicting conditions. Usually, a low electrical resistivity carries along with it a high thermal conductivity. The total output of a thermoelectric element is determined by the difference between the temperature of the hot junction and the temperature of the cold junction. This difference also determines the Carnot efficiency of the element and may be here called $\Delta T$. The hot junction temperature is limited by the temperature which the material of the element is capable of withstanding; the cold junction temperature is determined by the temperature gradient through the element and the steepness of this gradient is limited by thermal and physical considerations.

There are high-temperature-resistance elements, such as silicon-germanium, which can withstand a temperature as high as 1000° C. But these elements have a low Q. There are low-temperature-resistance elements, such as lead-telluride, which have a high Q but cannot withstand a temperature higher than about 600° C.

Thermoelectric generators in accordance with the teachings of the prior art have been composed either of high-temperature-resistance, low Q, thermoelectric elements only or of low-temperature-resistant, high Q elements alone. These generators have been found wanting in their capability of delivering power at high efficiency.

It is an object of this invention to overcome this deficiency.

This invention in one of its aspects arises from the realization that prior-art thermoelectric generators are inadequate because they are made of elements of only one type of material. Where the $\Delta T$ was high, the Q was low, and where the Q was high, the $\Delta T$ was low.

In accordance with this invention a thermoelectric generator is provided which includes both high-temperature and low-temperature resistant elements. Thermally, the elements are connected between a heat source operating through a hot plate, and a heat sink operating through a heat rejection plate. The hot junction of the high temperature-resistant elements is in direct heat-interchange relationship with the hot plate and the cold junction of the low-temperature resistant element is in direct heat-interchange relationship with heat rejection plate. The cold junction of the high-temperature-resistant element and the hot junction of the low-temperature-resistant element are interconnected through a highly heat conducting medium and are at intermediate temperatures between those of the heat source and heat sink. Between these intermediate temperatures there is a relatively small difference. Electrically the thermoelectric elements are connected in series with their output voltage adding. Thermally the high-temperature-resistant elements are in parallel and the low-temperature-resistant elements are in parallel and the parallel sets of elements are in series.

The $\Delta T$ for this generator is high, Typically, silicon-germanium elements, which withstand a temperature of about 1000° C., may be used with lead-telluride elements, which withstand about 600° C. The $\Delta T$ for such a generator would be about 700° C.

Another difficulty with prior-art generators arises from the problem of providing the elements with effective thermal and electrical connections. Connecting straps may be brazed to the terminals of the high-temperautre resistant elements using brazing compounds which melt at about 600 or 700° C. But attempts to braze connecting straps to the low-temperature-resistant elements has resulted in fragile structures which are readily damaged. It is an object of this invention to overcome the above-described difficulty and to provide mechanically rugged thermoelectric elements of the low-temperature-resistant type having highly thermally and electrically conducting connections. It is another object of this invention to provide a highly thermally and electrically conducting connection between thermoelectric elements of the high-temperature and low-temperature-resistant type. A more general object of this invention is to provide a mechanical connection of high thermal conductivity between a heat source and a heat sink.

In accordance with an aspect of this invention electrical contact with a low-temperature-resistant thermoelectric element is established by compressing a yieldable contact in firm thermal and electrical engagement with the element. The compression is effected by a low-thermal-resistant resilient member interposed between yieldable members urged respectively into firm electrical and thermal contact with the high-temperature-resistant element, through brazed conductors on one side, and with the low-temperature-resistant element through non-adhering but firm contacts on the other side. The resilient member is a fine-wire mesh, which has capillary properties, and is immersed in a material such as cesium which is liquid at the temperature of the hot junction of the low-temperature-resistant element and vaporous at the temperature of the cold junction of the high-temperature-resistant element. The liquid travels through the mesh by capillarity from the hot junction of the low-temperature-resistant element to the cold junction of the high-temperature-resistant element where it is vaporized. The vapor is recondensed at the junction. There is thus effective transfer of heat, by conversion of heat of vaporization of the material, from the cold junction to the hot junction and the path between the cold junction and the hot junction has low thermal impedance.

It has been discovered that thermoelectric generation of power is improved by cascading pairs of thermoelectric elements of different types by abutting the elements of each pair. For example, lead telluride negative elements type TEGAS–3N and 2N may be so cascaded. But such elements have different electrical and/or thermal properties and it is necessary that the abutting materials have relative areas corresponding to the different properties. For example, the electrical impedance of two elements must be matched. In situations where the impedances per unit area are different for the cascaded elements the areas of the abutting surfaces must be dimensioned so that the impedances match.

In accordance with the teachings of the prior art the proper dimensioning is achieved by reducing the cross section of one of the cascaded elements. But it has been found that the element of smaller cross section is in this case fragile and has a tendency to crack or otherwise deteriorate.

It is another object of this invention to overcome this difficulty and to provide a cascaded pair of thermoelectric elements in which the element of smaller cross section shall resist cracking or deteriorating.

In accordance with an aspect of this invention the smaller cross section is achieved by providing internal holes or cavities in the element of smaller cross section. Both elements of each cascaded pair are in this case sturdy and resist cracking.

The novel features considered characteristic of this invention are disclosed above. For a better understanding of this invention, both as to its organization and as to its method of operation, together with additional objects and advantages thereof, reference is made to the following description, taken in connection with the accompanying drawings, in which.

The drawings show an electronic generator including a block 11 of high-temperature-resistant thermoelectric elements and a block 13 of low-temperature-resistant thermoelectric elements. Specifically, the block 11 includes oppositely doped hole, or P-type, silicon germanium thermoelectric elements THP and electron, or N-type silicon germanium thermoelectric elements THN respectively. The block 13 includes lead telluride thermoelectric elements but is more complex than block 11. Block 13 includes two types each of the P-type and N-type elements THP1 and THP2 and THN1 and THN2, respectively. The P-type elements THP1 and THP2 respectively are TEGS–2P and TEGA–2P respectively; the N-type elements THN1 and THN2 are TEGAS–3N and TEGAS–2N respectively. The different P-type and N-type elements of block 13 THP1 and THP2 and THN1 and THN2 are connected in pairs with one of their surfaces abutting to form (FIG. 2) composite units.

The units THN1 and THN2 have different thermal and electrical properties. So that these properties may be matched at the surfaces of the junction J of each pair the units THN2 are, in accordance with an aspect of this invention, each provided with a hole 15 which equalizes the properties.

Figure 4:
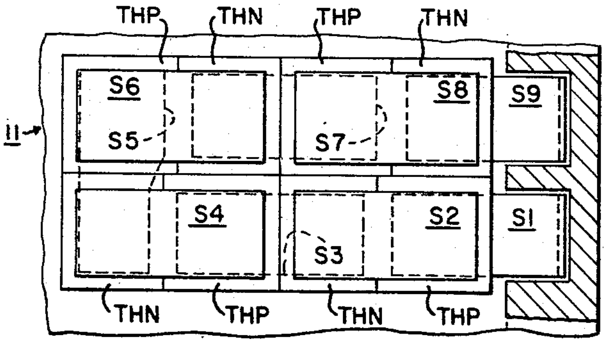
FIG. 4 is a view in section taken along line IV—IV of FIG. 2.

Electrically the elements THP and THN are connected in cascade by straps S1 through S8 (FIG. 4) each strap interconnecting a positive and a negative element. For example, strap S2 connects the first element THP on the right in FIG. 2 to the element THN to the left of it, strap S5 connects the first element THN on the left of FIG. 2 to the element THP just below it, with reference to FIG. 2 (see FIG. 4). The strap S1 connects the element THP on the right to the first element THP1 in the right of block 13.

Figure 3:
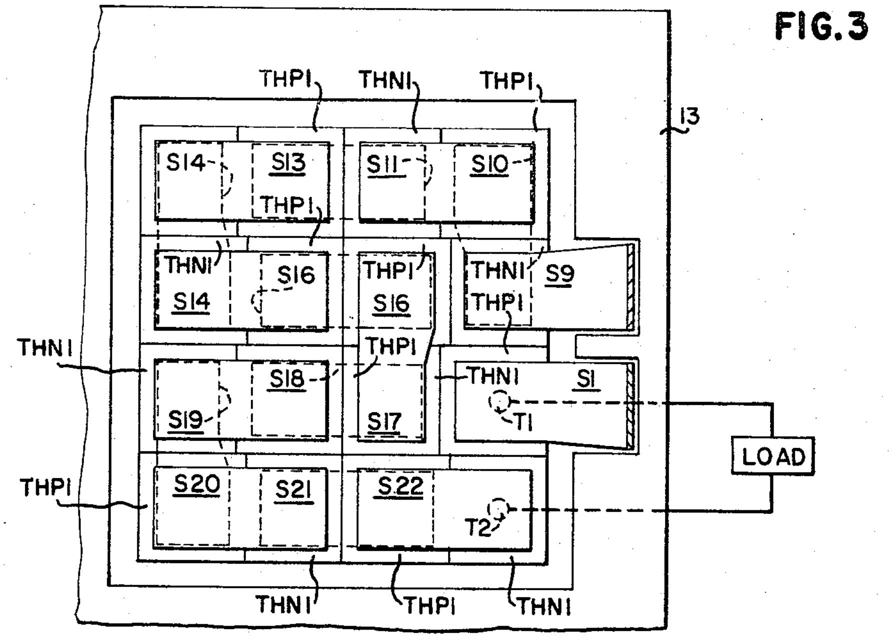
FIG. 3 is a view in section taken along line III—III of FIG. 2.
Figure 2:
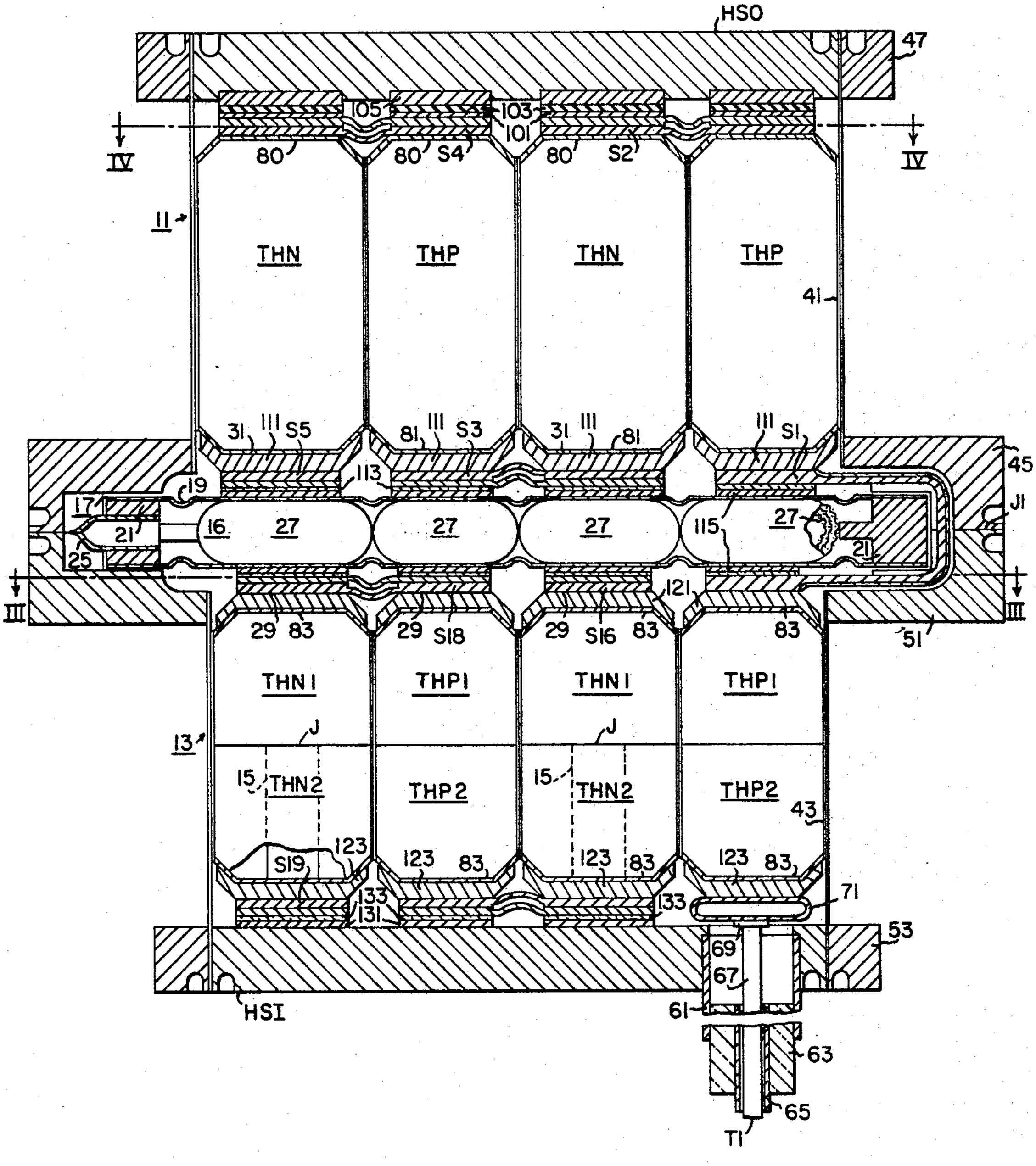
FIG. 2 is a view in section showing the embodiment of FIG. 1.

The elements THP1–THP2 and THN1–THN2 of block 13 are cascaded electrically by straps S9 through S22 (FIGS. 2 and 3). For example, the unit THN1–THN2 on the left of FIG. 2 is connected to the unit THP1–THP2 next to it by strap S18 (FIG. 2), the strap S19 connects the unit THN1–THN2 on the left to the unit THP1–THP2 just below it, with reference to FIG. 2 (see FIG. 3).

Thermally the elements THP and THN of block 11 are connected in parallel and the unit THP1–THP2 and THN1–THN2 are connected in parallel. The two parallel units 11 and 13 are, in accordance with this invention, interconnected by a highly thermally conducting member 16 which serves not only for thermal connection but also to apply contact pressure to the units THP1–THP2 and THN1–THN2 of the low-temperature-resistant block 13.

The thermally conducting member 16 includes a vacuum-tight elongated container 17 of generally rectangular cross section. The container 17 includes a yieldable or flexible wall or membrane 19 which typically may be composed of AISI–304–L stainless steel. The wall 19 is sealed at the ends vacuum-tight to peripheral support 21. On one side the support 21 has an exhaust tubulation 25 through which the container 17 is exhausted. After the container 17 is exhausted the tubulation 25 may be pinched off.

Within the container 17 there are a plurality of pressure-exerting springs 27 which press the yieldable or flexible wall 19 outwardly. Each spring 27 is composed of a mesh or cloth of fine wire or thread. Typically, the wire may be No. 100 AISI–304 wire. The cloth of each spring is wound into a roll of generally spiral cross section typically having about four turns. The rolls are inserted in the container 17 so that they are compressed by the wall 19 and produce a reacting force which urges the wall 19 outwardly.

Within the container 17 metal such as cesium (or gallium) is deposited. The cesium is liquid at the temperature of the hot junction 29 of the block 13 and vaporous at the temperature of the cold junction 31 of the block 11. The liquid cesium in thermal interchange with the junction 29 passes by capillarity through the mesh 27 onto thermal interchange with junction 31 where it is vaporized. The vapor returns to thermal interchange with junction 29 and is condensed. Heat is thus transferred from junction 31 to junction 29 effectively by conversion of heat of vaporization into heat of liquefication.

Figure 1:
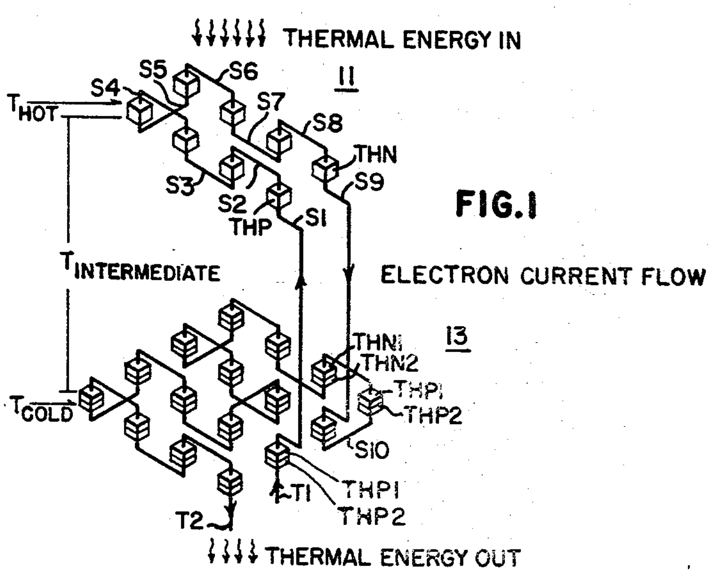
FIG. 1 is a diagrammatic view in isometric showing a preferred embodiment of this invention.

The blocks 11 and 13 are enclosed in an evacuated container. This container includes thin wall sections or envelopes 41 and 43 which typically may be composed of the iron, chromium, aluminum cobalt alloy Kanthal. The envelope 41 which encloses block 11 is sealed between a support plate 45, typically of Kanthal alloy and the hot end plate HSO which typically is also composed of Kanthal alloy. The heat source which heats plate HSO is represented by arrows in FIG. 1. The envelope by a platinum-gold brazing compound. The envelope 41 is brazed to the center support plate 45 typically 41 is welded between the hot end plate HSO and a peripheral heat sink plate 47.

The envelope 43 which encloses block 13 is brazed to a center support plate 51 also of Kanthal alloy by a platinum-gold brazing alloy and is welded between a heat rejection plate HSI and a peripheral heat-sink plate 53. The plates HSI and 53 are typically composed of Kanthal alloy. The plate HSI is cooled by a heat sink which is represented by an arrow.

The end plates 45 and 51 are welded at the joint J1 between them. The container formed by HSO, 47, 41, 51, 43, 53, HSI may be filled with a mixture of about 95% by volume of argon and 5% by volume of hydrogen. The hydrogen acts as a reducing agent to reduce oxides on the internal parts of the apparatus.

The generator includes terminals T1 and T2 which are sealed through plate HSI. Each terminal T1 and T2 includes an outer tube 61 brazed vacuum tight into a hole in the plate HSI. The tube 61 has sealed near its outer end a hollow-ceramic cylinder 63. A tube 65 through which a connecting pin 67 extends is brazed vacuum tight to the ceramic cylinder 63. The head 69 of the pin 67 engages a flattened loop 71 which is resilient and exerts contact pressure on the head 69.

The thermoelectric element THP and THN are of generally trapezoidal form at the ends and are each provided with an end cap 80 at the hotter end and end cap 81 at the cooler end. Typically these end caps 81 are composed of a high-melting-point refractory material such as tungsten. The end caps 81 are sprayed or vapor-deposited on the ends of the elements THP and THN.

The ends of the elements THP1–THP2 and THN1–THN2 are likewise trapezoidal and are provided with end caps 83 typically of iron. The end caps 83 are thin caps spray deposited on the ends of the elements THN1–THP1. The hydrogen in the atmosphere within the container HSO–41–43–HSI reduces any oxide on the iron caps 83.

The straps S2, S4, S6, S8, typically are composed of a high-temperature-resistant material such as platinum and are brazed directly to the respective end caps 80 to which they are connected. A nickel-titanium brazing alloy may be used. The straps S2, S4, S6, S8 are platinum so that they are capable of withstanding the high temperatures of the hot junction of the elements THP and THN.

The straps S2, S4, S6 and S8 are each joined to the hot end plate HSO through a thermally highly-conducting, but electrically insulating connection. Each connection includes a thermal expansion compensating strip 101, typically of tungsten, an electrically insulating, but thermally conducting, strip 103 trypically or zirconia and another strip 105 of tungsten. Each strip 101 is joined to the abutting strap S2, S4, S6 or S8 by brazing; each insulating strip 103 is joined to the abutting strip 101 by brazing; each strip 103 is joined to the abutting strip 105 and each strip 105 is joined to the plate HSO by brazing. Nickel titanium typically serves as brazing alloy.

Shoes 111 are interposed between the straps S1, S3, S5, S7 and S9 respectively and the tungsten coatings or end caps 81 on the ends of the associated elements THP and THN. Typically the shoes 111 are composed of copper and are brazed to the end caps 81. The brazing alloy typically may be copper-titanium.

The straps S1, S3, S5, S7, S9 are connected to the yieldable shell 19 of the resilient member 16 through an electrically insulating channel of high thermal conductivity. This channel includes an insulating strip 113 typically of silica base ceramic. A copper strip, or braze plate, 115 is interposed between the strip 113 and the membranes 19. The strip 115 is brazed to the shell 119 by a copper-silver brazing alloy. The strip 113 is a common glaze on the straps S1, S3, S5, S7 and S9 and the strip 115.

The straps S1 and S9 are of generally U-shape extending between the shoes 81 of the right-hand element THP and the element THN (not shown) below it, with reference to FIG. 2, respectively and the copper shoes 121 of the right-hand element THP1 and the element THN1 (not shown) below it with reference to FIG. 3. The straps S1 and S9 are brazed to the shoes 121 by a copper brazing alloy. The surfaces of the yokes of the straps S1 and S9 are glazed with a silica base ceramic for insulating purposes.

The straps S10, S12, S14, S16, S18, S20 and S22 are composed typically of copper and are respectively brazed to the shoes 121 which are compressed against the abutting end caps 83 of the respective elements THP1 and THN1. Typically a copper-silver brazing alloy may be used to braze these elements.

The straps S9, S11, S13, S15, S17, S19, and S21 are of copper and are brazed to copper shoes 123 which engage the end caps 83 on the ends of the opposite elements THP2 and THN2 of the block 13. Typically the brazing alloy in this case may be copper-titanium alloy.

The straps S9, S11, S13, S15, S17, S19 and S21 are joined to copper strips 131 by silica-base ceramic glaze 133 which insulates the straps from the strips 131. The strips 131 are brazed to the heat sink or heat rejection plate HSI. The ceramic glaze 133 has high thermal conductivity.

The shoes 121 and 123 are not adhesively joined to the end plates 83 and the end plates 83 are not adhesively joined to the respective elements THP1, THN1, THP2, THN2, (the bond at the junction of 83 and the elements is predominately mechanical), but the shoes 121 and 123 are maintained in firm thermal and electrical engagement with the end caps 83 and the end caps with the elements by the resilient member 16.

The generator described above has a high $\Delta T$ because the hot junction of the block 11 is at a high temperature which it is capable of withstanding. In addition advantage is taken of the high Q of the block 13 of low-temperature-resistant elements without deteriorating these elements. No substantial heat loss is encountered in the heat transfer between blocks 11 and 13 because of the heat-transfer properties of the resilient member.

The following summary may help in the understanding of the invention:

This invention is a thermoelectric generator module which utilizes thermoelectric elements THP, THN of materials capable of operating at high temperatures (1000° C.) and rejecting heat at room temperature (1000° C. or lower) in heat interchange relationship with elements THN1, THN2, THP1, THP2 of low-temperature-resistant high Q material. The thermoelectric elements are cascaded: i.e., a high temperature element THP, THN, such as silicon-gremanium, is used as the high temperature leg and a low temperature element THP1, THP2, THN1, THN2, is used as the lower temperature leg. A metal envelope 41, 43, HSO, HSI, hermetically seals the module to prevent oxidation and sublimation of the thermoelectric elements. The use of this hermetic can surrounding the module also allows for the incorporation of thermal transfer appendages at the hot and cold end of the modules. To thermally match the silicon-germanium and lead telluride materials, the silicon-germanium are electrically connected in the series but are thermally in parallel. An electrical conductor strap 19 thermally connects the silicon-germanium portion 11 of the module with the lead telluride portion 13 of the module. The thermal energy passes through the silicon-germanium and into the lead telluride lower temperature portion 13 of the module.

Thermal stress is eliminated as is the loss due to temperature drops through resilient member 16 by the use of a "Conducta-Spring" (FIG. 2). This member produces contact pressure on the thermoelectric elements and junctions, and acts as a thermal short. The thermal short is based on the concept of the heat pipe as a thermal transfer mechanism, and utilizes the capillary mesh 27 used in the heat pipe principle as a flexible spring to supply pressure to both the silicon-germanium and the lead telluride elements. The heat pipe spring 17 is placed between two blocks 11 and 13 of the module and is partially filled with cesium. This insures greater reliability since pressure contacts are more reliable than brazed contacts. A square module is shown in FIGS. 1 through 4 although one of circular section may also be used. Under atmospheric pressure the envelope would be supported by the elements themselves. Each element is insulated from its neighbor by a .002 inch ceramic coating or strip 103 and 113. At high temperature the strip 103 is zirconia at lower temperatures the strip 113 is a ceramic glaze.

The module includes hot end plate HSO of Kanthal alloy. It could be any other oxidation resistant material. It is either welded to a heat source or receives thermal energy by radiation from a heat source. A weld heat sink 47 is placed peripherally around the hot end plate HSO and in the assembly step during manufacture. The weld heat sink closes up any ripple mismatch between the thin Kanthal alloy envelope 41 and the hot end plate HSO. This facilitates the welding which rigidly joins the envelope 41 to the hot end plate HSO and weld heat sink forming a hermetic seal between similar materials.

A connector assembly including each of the straps S2, S4, S6 and S8 and the strips 101, 103, 105 is manufactured separately from the module in one simple brazing operation. It is then brazed to the module hot end plate HSO with nickel-titanium brazing alloy. The tungsten strip 105 is set into the plate HSO so that the tungsten is in compression when the module cools from the braze temperature. The brazing alloy between strip 105 and HSO at the interface is not then subjected to the full shearing force. The zirconia insulator 103 insulates each of the electrical straps S2 through S8 of platinum to prevent electrical shorting of the silicon-germanium elements. The insulator 103 is sandwiched between a braze strip 105 and an expansion compensator strip 101. The expansion of the tungsten 101 in each case matches the expansion of zirconia 103 and also matches the expansion of the abutting end cap 81 of tungsten, which is vapor deposited on the silicon-germanium. The end caps 81 prevent bending stress from injuring the thermal contact by reason of warpage of the connector assembly. The straps S2 through S8 are of platinum because of the ductility and low strength of platinum, thus minimizing compression and thermal stress problems. Columbium coated copper would also be satisfactory. Platinum's vapor pressure at the desired hot junction temperature of 1000° C. is very low, but the vapor pressure of the next most suitable material, copper, is too high for operation at this temperature. The platinum as well as the copper conductors are bent to insure flexibility. The nickel-titanium alloy braze is used since this alloy has been proved by experience in brazing of ceramics and ceramic-to-metal-seals to be suitable.

The hot end caps 80 of tungsten form a low-electrical-impedance contacts to the end of the silicon-germanium. The "P" and "N" silicon-germanium elements THP and THN are sized to provide the proper thermal and electrical characteristics for maximum efficiency. The hot side envelope 41 is of Kanthal alloy because of the oxidation resistance and low conductivity of this alloy. Kanthal alloy can be rolled to small thicknesses. At the cold junction of the silicon-germanium, end cap of tungsten 81 is brazed with a copper-titanium alloy to the straps S1, S3, S5, S7, S9 of copper. Since oxygen-free high conductivity soft annealed copper is used for the straps and a pressure contact is supplied at this point through yieldable wall 17, flexibility of this joint is assured by the use of copper. A copper-silver alloy is used to braze the silicon-germanium elements to a central shunt strap S1 of copper which connects the entire series string of silicon-germanium elements of block 11 to the lower temperature lead telluride elements of block 13. A module center support plate 45 forms a rigid backup as well as a convenient separation of the two modules. The envelope 41 is fixture brazed to the module center support plate using an oxidation-resistant platinum-gold alloy. This joint is brazed because of the space limitations in this region and to avail ease of assembly. A weld joint could be used.

The member 16 has the following advantages:

(1) The member 16 forms an excellent thermal conductor to distribute the heat uniformly from the smaller area silicon-germanium block 11 to the larger area lead telluride block 13.

(2) A very small but compact member 16 with excellent heat transfer capability can be housed in a small space, thus maintaining minimum size, maximum efficiency, and light weight.

(3) Flexibility and compression for both Si-Ge and Pb-Te elements can be accomplished with the same member 16.

(4) The yieldable wall or membrane 16 has an embossed surface, which coupled with the flexibility of the resilient means 27, ensures even seating at the junction for both lead telluride (13) and silicon-germanium elements (11).

The yieldable wall or flexible membrane 19 is of stainless steel AISI 304–L which is highly cesium resistant. The membrane 19 is brazed by means of a cesium resistant nickel-titanium alloy to the peripheral supports 21. This peripheral support 21 is a square external case which is merely used to facilitate manufacturing and assembly. Internal to the flexible membrane sheets are spring capillaries 27 which act to apply restoring force as well as a capillary to conduct the liquid cesium for heat transfer purposes. Each spring 27 is composed of four turns of 100 mesh stainless steel AISI 304–L screen. The turns of springs 27 as formed approach circular contour; by compressing the springs into the flat shape shown, a pressure of approximately 200 pounds per square inch is exerted on the silicon germanium and the lead telluride elements of blocks 11 and 13 respectively. The cesium which has a pressure of approximately 8 pounds per square inch at the 830° K. temperature of this junction provides the thermal conductivity necessary to minimize the thermal drop across the member 16. The thermal drop of less than 1° K. The silicon-germanium cold junction is insulated electrically by means of a ceramic glazing 113. A braze plate or strip 115 of copper is used to simplify the brazing of the copper member to the flexible stainless steel membrane 19. The stainless steel spring 27 serves to press both on the silicon-germanium as well as the lead telluride. The member 16 is designed not to exceed the compression stress of lead telluride since the silicon-germanium is much stronger.

The shoes 121 are of copper and are not adhered to the end caps 83 but are pressed against the vapor deposited on these caps. The shoes 121 are brazed to the straps S1, S9, and S10 through S22, by a copper-silver brazing alloy. The trapezoidal or tapered end structure minimizes edge cracking effects which would occur with a flat sheet of joined disimilar metals. By tapering the ends, the weaker semiconductors THP1, THP2, THN1, THN2 are trapped in the stronger metal cup 121, and edge cracking and element seating problems are minimized.

Two different types of lead telluride, THP1, TEGS–2P, and THP2, TEGA–2P, and two different types of "N" type lead telluride, THN1, TEGAS–3N, and THN2, TEGAS–2N, are used. The elements THP1, THP2, THN1, THN2 may be of tin telluride or other thermoelectric materials in place of the lead telluride. These four materials are selected to maximize the lead telluride performance over the temperature range. In the lead telluride elements THP1, THP2, THN1, THN2, the current as well as the thermal energy flows consecutively through the two "P" types and through the two "N" types. It is feasible to do this with the lead tellurides and still operate near the optimum design point of both materials. The elements THN2 have a hole 15. This hole maintains the proper area ratio balance between the higher temperature element THN1 and the lower temperature element THN2 with a specific current flowing through both of them.

The connections to the cold-junction ends of the lead telluride elements THP2, THN2 are similar to those at the hot junction ends. There are the iron end caps 83, the shoes 123 joined to the straps S11, S13, S15, S17, S19, S21 by brazing with copper-titanium alloy. There are the glazing insulator 133 and braze plates or strips 131. The cool side envelope 43 is made of KANTHAL alloy as the module heat rejection end plate HSI. In this manner, the entire module is encased in a cladding of Kanthal alloy. Since the entire unit is clad with this material, similar materials are metallurgically joined at every joint, thus increasing the reliability and safety of operation. Also, since the thermoelectric elements are under compression and not attached to the envelope 43 thermal expansion mismatches are of no concern.

The external electrical connections are made through a standard ceramic-to-metal feedthrough terminals T1 and T2. The heat rejection fin or heat sink 53 can be brazed, welded, or even attached by mechanical means to the module heat rejection end plate HSI.

The following are the principal novel features of this invention:

(1) A combination heat-pipe spring resilient member which provides a constant pressure to maintain low electrical loss electrode contacts as well as to provide a high heat conductivity to maximize module efficiency.

(2) A module envelope 41, 43 which provides structural stability, oxidation protection, and protection against element evaporation on module degradation.

(3) High temperature thermoelectric elements 11 cascaded with low temperature elements 13.

(4) The use of vapor deposited coatings for precise thermal insulation of the thermoelectric elements and for maintenance of low thermal loss thermoelectric junctions.

(5) A structure which is near to theoretical maximum in conversion efficiency, and yet is practical, reliable, light weight, and shock resistant.

(6) A structure which allows heat rejection and heat acceptance fins 47 and 53 for appendages to be easily attached allowing the module to be coupled to a variety of heat sources and to several heat rejection environments including air and the vacuum of space. It is particularly adaptable to nuclear reactor and radioisotope heat sources.

(7) A module ideally constructed for use with high performance insulation in both terrestrial and vacuum of space environments.

(8) It is estimated that the high efficiency module disclosed has a specific weight of 114 pounds per kilowatt, and operates at a 12.2% efficiency between a hot junction temperature of 1000° C. and a heat-rejection temperature of 176° C.

I claim as my invention:

1. A generator of electrical power comprising first thermoelectric means, a heat source in heat-interchange relationship with said first means, second thermoelectric means, a heat sink in heat-interchange relationship with said second means, low thermal impedance resilient means thermally interconnecting said first and second means, thermally and electrically conducting means engaged by said resilient means and held in good thermal-transfer and electrical-transfer contact at least with said second means, whereby a low thermal impedance path between said first means and said second means is established by said resilient means, and means connecting said first thermoelectric means and said second thermoelectric means in series aiding relationship in an electrical circuit.

2. A generator of electrical power comprising first thermoelectric means, a heat source in heat-interchange relationship with said first means, second thermoelectric means, a heat sink in heat-interchange relationship with said second means, resilient means thermally interconnecting said first and second means and establishing a low thermal impedance path between said first means and said second means, and means connecting said first thermoelectric means and said second thermoelectric means in series aiding relationship in an electrical circuit, resilient means beng a fine-wire mesh compressed between said first means and said second means, said mesh exerting forces respectively on said first means and said second means respectively, to urge said first means and said second means into low-thermal-impedance connection with said heat source and heat sink respectively.

3. A generator of electrical power comprising first thermoelectric means, a heat source in heat-interchange relationship with said first means, second thermoelectric means, a heat sink in heat-interchange relationship with said second means, resilient means thermally interconnecting said first and second means and establishing a low thermal impedance path between said first means and said second means, and means connecting said first thermoelectric means and said second thermoelectric means in series aiding relationship in an electrical circuit, the said generator including means for transferring heat between the heat source and the heat sink, the said heat-transferring means including a material between the first thermoelectric means and the second thermoelectric means, said material being liquid at the temperature of said second means and vaporous at the temperature of said first means, the said generator also including capillary means for transferring said liquid from said second means so that said material is continuously circulated between said second means and said first means effecting transfer of heat by vaporization.

4. A generator of electrical power comprising first thermoelectric means, a heat source in heat-interchange relationship with said first means, second thermoelectric means, a heat sink in heat-interchange relationship with said second means, resilient means thermally interconnecting said first and second means and establishing a low thermal impedance path between said first means and said second means, and means connecting said first thermoelectric means and said second thermoelectric means in series aiding relationship in an electrical circuit, said resilient means including a fine wire mesh and said generator including means for transferring heat between the heat source and the heat sink the heat-transferring means including a material which is liquid at the temperature of the second thermoelectric means and vaporous at the temperature of the first thermoelectric means, said heat-transfer being effected by absorption of heat of vaporization of said material from said first means and by the transfer by said material of heat of condensation to said second means, said material being transferred in liquid form from said second means to said first means by capillarity through said mesh.

5. Heat transfer apparatus including a heat source and a heat sink, first yieldable thermal contact means in heat-interchange relationship with said heat source, second yieldable thermal contact means in heat-interchange relationship with said heat sink, resilient capillary means in engagement with said first and second contacts urging said first contact into firm thermal engagement with said heat source and said second contact into firm thermal engagement with said heat sink, and a material between said contacts which is in liquid phase at a first temperature and in vaporous phase at a second temperature higher than said first temperature, said first contact being maintained at said second temperature and said second contact being maintained at said first temperature, and said material in liquid phase flowing between said second contact and said first contact by capillarity.

6. The apparatus of claim 5 wherein the first and second contacts are in an enclosure enclosing the vapor of the material and said vapor is at a substantial pressure exerting pressure on the first and second contacts and improving the thermal engagement of the first and second contacts in heat interchange relationship with the heat source and heat sink respectively.

7. A generator of electrical energy including first thermoelectric means, said first means being composed of a material capable of withstanding heating substantially up to a first higher temperature and having a hot junction and a cold junction, second thermoelectric means, said second means being composed of a material capable of withstanding heating substantially up to a second substantially lower temperature than said first temperature, and having a hot junction and a cold junction, a heat source in heat-interchange relationship with said hot junction of said first means, a heat sink in heat-interchange relationship with said cold junction of said second means, thermally conducting means connected between said cold junction of said first means and said hot junction of said second means to transfer heat from said last-named cold junction to said last-named hot junction, and means connecting said first and second means in voltage adding relationship, said first means being maintained at a temperature below said first temperature and said second means being maintained at a temperature below said second temperature.

8. The generator of claim 7 including resilient contact means having high thermal conductivity connected to the first and second means for establishing a thermal path of high thermal conductivity between said first means and said second means.

9. A generator of electrical power including a first thermoelectric element in the form of a solid block, a second thermoelectric element in the form of a second block and having appreciably different electrical properties than said first element, said first element having a surface in current transfer engagement with a corresponding surface of said first element, said second element having a hollow region dimensioned to compensate for said differences in the electrical properties.

10. The generator of claim 9 wherein the outer peripheries of the surfaces of engagement of the blocks are congruent.

11. The generator of claim 9 including a heat source and a heat sink, one of the blocks being connected in heat-interchange relationship with the heat source and the other with the heat sink.

12. The generator of claim 7 wherein the first thermoelectric means has a substantially lower Q than the second means wherein $Q=V^2/K\rho$ for a thermoelectric element, and
V=voltage delivered by the element between its hot and cold junctions per Kelvin degree,
K=thermal conductivity of the element,
$\rho$=electrical resistivity of the element.

13. A thermoelectric source of current comprising first thermocouple elements, a heat source in heat-interchange relationship with the first thermocouple elements, second thermocouple elements a heat sink in heat-interchange relationship with the second thermocouple elements, means thermally interconnecting said first and second thermocouple elements, the first and second thermocouple elements being electrically connected in series, characteristized in that the first and second thermocouple elements have different Q's respectively, wherein $Q=V^2/K\rho$ for a thermoelectric element, and
V=voltage delivered by the element between its hot and cold junctions per Kelvin degree,
K=thermal conductivity of the element,
$\rho$=electrical resistivity of the element.

14. A generator of electrical power comprising first thermoelectric means, a heat source in heat-interchange relationship with said first means, second thermoelectric means, heat-absorbing means in heat-interchange relationship with said second means, and means thermally interconnecting said first means and said second means and establishing a low thermal-impedance path between said first means and said second means, said interconnecting means including means for cycling a vaporizeable fluid between said first means, where it arrives in liquid phase and is converted into vapor phase absorbing, from said first means, heat of vaporization, and said second means, where it arrives in vapor phase and is converted into liquid phase giving up to said second means heat of condensation.

15. The generator of claim 14 wherein the first thermoelectric means is capable of operating at a substantially higher temperature than said second thermoelectric means.

16. The generator of claim 14 wherein the interconnecting means includes capillary means through which the fluid flows in liquid phase from the second thermoelectric means to the first thermoelectric means.

References Cited

UNITED STATES PATENTS

| | | | |
|---|---|---|---|
| 3,277,827 | 10/1966 | Roes | 136—205 X |
| 3,136,134 | 6/1964 | Smith | 136—201 |
| 3,208,877 | 9/1965 | Merry | 136—212 |
| 3,229,759 | 1/1966 | Grover | 165—105 |

FOREIGN PATENTS

| | | |
|---|---|---|
| 1,264,219 | 5/1961 | France. |

WINSTON A. DOUGLAS, Primary Examiner

M. J. ANDREWS, Assistant Examiner